US011289156B2

(12) United States Patent
Frank et al.

(10) Patent No.: US 11,289,156 B2
(45) Date of Patent: Mar. 29, 2022

(54) BALLISTIC REVERSIBLE SUPERCONDUCTING MEMORY ELEMENT

(71) Applicant: National Technology & Engineering Solutions of Sandia, LLC, Albuquerque, NM (US)

(72) Inventors: Michael P. Frank, Albuquerque, NM (US); Erik Debenedictis, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 30 days.

(21) Appl. No.: 16/943,613

(22) Filed: Jul. 30, 2020

(65) Prior Publication Data
US 2022/0036943 A1    Feb. 3, 2022

(51) Int. Cl.
*H01L 39/12*    (2006.01)
*H01L 39/00*    (2006.01)
*G11C 11/44*    (2006.01)
*G11C 11/16*    (2006.01)
*H01L 39/10*    (2006.01)
*H01L 39/02*    (2006.01)
*H01L 39/22*    (2006.01)
*G01R 33/035*    (2006.01)

(52) U.S. Cl.
CPC .......... *G11C 11/44* (2013.01); *G01R 33/0354* (2013.01); *G11C 11/1673* (2013.01); *G11C 11/1675* (2013.01); *H01L 39/025* (2013.01); *H01L 39/223* (2013.01)

(58) Field of Classification Search
CPC . G11C 11/44; G11C 11/1673; G11C 11/1675; G01R 33/0354; H01L 39/025; H01L 39/223
USPC ........................................................ 365/162
See application file for complete search history.

(56) References Cited

U.S. PATENT DOCUMENTS

| 4,749,888 | A | * | 6/1988 | Sakai | G11C 19/32 |
| | | | | | 257/31 |
| 5,331,162 | A | * | 7/1994 | Silver | H01L 39/10 |
| | | | | | 250/336.2 |
| 5,472,934 | A | * | 12/1995 | Akoh | H01L 39/225 |
| | | | | | 505/190 |
| 6,239,431 | B1 | * | 5/2001 | Hilton | G01K 7/006 |
| | | | | | 250/336.2 |
| 9,385,293 | B1 | * | 7/2016 | Nayfeh | H01L 39/223 |
| 9,646,682 | B1 | * | 5/2017 | Miller | G11C 5/147 |

(Continued)

OTHER PUBLICATIONS

Frank, M. P. et al., "Asynchronous Ballistic Reversible Computing using Superconducting Elements," ACS BAA Portfolio Review, Presentation, Apr. 2020, 27 pages.

(Continued)

Primary Examiner — Ly D Pham
(74) Attorney, Agent, or Firm — Yee & Associates, P.C.

(57) ABSTRACT

A reversible memory element is provided. The reversible memory element comprises a reversible memory cell comprising a Josephson junction and a passive inductor. A ballistic interconnect is connected to the reversible memory cell by a bidirectional input/output port. A polarized input fluxon propagating along the ballistic interconnect exchanges polarity with a stationary stored fluxon in the reversible memory cell in response to the input fluxon reflecting off the reversible memory cell.

21 Claims, 5 Drawing Sheets

(56) References Cited

U.S. PATENT DOCUMENTS

| | | | |
|---|---|---|---|
| 9,812,836 | B1 | 11/2017 | Osborn |
| 10,122,352 | B1* | 11/2018 | Miller ............... G11C 11/1655 |
| 2010/0102904 | A1* | 4/2010 | Kusmartsev ......... H03B 15/003 |
| | | | 333/24 R |
| 2012/0274494 | A1* | 11/2012 | Kirichenko ........... H03M 3/454 |
| | | | 341/133 |
| 2014/0113828 | A1* | 4/2014 | Gilbert ................. H01L 39/225 |
| | | | 505/100 |
| 2015/0263736 | A1* | 9/2015 | Herr ...................... G06N 10/00 |
| | | | 326/4 |
| 2016/0104672 | A1* | 4/2016 | Augur ............... H01L 21/76804 |
| | | | 257/774 |
| 2016/0225719 | A1* | 8/2016 | Jacob ............... H01L 23/53276 |

OTHER PUBLICATIONS

Frank, M. P. et al., "Asynchronous Ballistic Reversible Fluxon Logic," IEEE Transactions on Applied Superconductivity, vol. 29 (2019), 7 pages.

Frank, M. P. et al., "Implementing the Asynchronous Reversible Computing Paradigm in Josephson Junction Circuits," 21st Biennial U.S. Workshop on Superconductor Electronics, Devices, Circuits, and Systems, Presentation, Oct. 21, 2019, 25 pages.

Frank. M. P. et al., "Modeling Asynchronous Ballistic Reversible Computing (ABRC) Primitive Elements Using Superconducting Circuits," International Superconductive Electronics Conference, Poster, Jul. 2019.

Frank, M. P. et al., "Semi-Automated Design of Functional Elements for a New Approach to Digital Superconducting Electronics: Methodology & Preliminary Results," International Superconductive Electronics Conference, Presentation, Riverside, CA, Jul. 31, 2019, 12 pages.

Frank, M. P. et al., "Semi-Automated Design of Functional Elements for a New Approach to Digital Superconducting Electronics, Methodology and Preliminary Results," International Superconductive Electronics Conference, Conference Paper, Jul. 2019, 6 pages.

Frank, M. P. et al., "Asynchronous Ballistic Reversible Fluxon Logic," Applied Superconductivity Conference, Poster, Oct. 2018.

Frank, Michael P., "Asynchronous Ballistic Reversible Computing," 2nd IEEE International Conference on Rebooting Computing (ICRC2017), Presentation, Nov. 2017.

Frank, Michael P., "Asynchronous ballistic reversible computing," 2017 IEEE International Conference on Rebooting Computing (ICRC), Washington, DC, 2017, pp. 1-8, doi: 10.1109/ICRC.2017.8123659.

Osborn, K. D. and Wustmann, W., "Ballistic Reversible Gates Matched to Bit Storage: Plans for an Efficient CNOT Gate Using Fluxons," International Conference on Reversible Computation, Springer, 2018, pp. 189-204.

Wustmann, W. and Osborn, K. D., "Reversible Fluxon Logic: Topological Particles Allow Ballistic Gates Along 1D Paths," arXiv:1711.04339v1 (2017), 20 pages.

Osborn, K. D. and Wustmann, W., "Reversible Fluxon Logic for Future Computing," IEEE International Superconductive Electronics Conference (ISEC), 2019, 5 pages.

Yu, L. et al., "Experimental designs of ballistic reversible logic gates using fluxons," IEEE International Superconductive Electronics Conference (ISEC), 2019, 3 pages.

Osborn, K. D. and Wustmann, W., "Flux Solitons Studied for Energy-Conserving Reversible Computing," APS March Meeting 2015, abstract id. Z39.011, 1 page.

Wustmann, W. et al., "Autonomous Reversible Fluxon Logic Gates," APS March Meeting 2017, abstract id. C46.006, 1 page.

Wustmann, W. and Osborn, K. D., "Scattering to Different Vortex Polarity in Coupled Long Josephson Junctions," APS March Meeting 2016, abstract id. P25.008, 1 page.

Ren J., "Physically and Logically Reversible Superconducting Circuit," Ph.D. dissertation, The Graduate School, Stony Brook University, Stony Brook, N.Y., 2011, 147 pages.

Ren, J. and Semenov, F. K., "Progress with Physically and Logically Reversible Superconducting Digital Circuits," IEEE Transactions on Applied Superconductivity, 2011, vol. 21, pp. 780-786.

Ren, J. et al., "Progress Towards Reversible Computing with nSQUID Arrays," IEEE Transactions on Applied Superconductivity, 2009, vol. 19, pp. 961-967.

* cited by examiner

BALLISTIC REVERSIBLE SUPERCONDUCTING MEMORY ELEMENT

STATEMENT OF GOVERNMENT INTEREST

This invention was made with United States Government support under Contract No. DE-NA0003525 between National Technology & Engineering Solutions of Sandia, LLC and the United States Department of Energy. The United States Government has certain rights in this invention.

BACKGROUND

1. Field

The disclosure relates generally to superconducting electronic circuits, and more specifically to reversible computing using near-lossless superconducting elements.

2. Description of the Related Art

In general, whenever there is a goal of improving aggregate computational performance within any power-limited application scenario, the computational energy efficiency of the underlying information processing technologies must be improved as well. The computational energy efficiency refers to useful operations performed per unit of energy dissipated. The underlying technologies might include the logic, memory, and communication functions.

In most situations, when manufacturing cost is a concern, there is also a goal of improving the energy efficiency of the technology at any given cost-efficiency design point (defined as aggregate performance per unit manufacturing cost). This goal raises a serious challenge for any long-term strategic plan for innovation in future computing technologies, namely, to find a sustainable path for continuing to improve computational energy efficiency that also minimizes any negative impacts on manufacturing cost-efficiency.

Therefore, it would be desirable to have a method and apparatus that take into account at least some of the issues discussed above, as well as other possible issues.

SUMMARY

An illustrative embodiment provides a reversible memory cell. The reversible memory element comprises a reversible memory cell comprising a Josephson junction and a passive inductor. A ballistic interconnect is connected to the reversible memory cell by a bidirectional input/output port. A polarized input fluxon propagating along the ballistic interconnect exchanges polarity with a stationary stored fluxon in the reversible memory cell in response to the input fluxon reflecting off the reversible memory cell.

Another illustrative embodiment provides a reversible memory element. The reversible memory element comprises a long Josephson junction configured to ballistically propagate an input fluxon representing a single bit of polarized binary data. The reversible memory element also comprises a reversible memory cell comprising a Josephson junction and a passive inductor, wherein the reversible memory cell is configured to store a stationary fluxon representing a single bit of polarized binary data. A bidirectional input/output port connects the long Josephson junction and reversible memory cell. The reversible memory cell is configured to exchange the single bit of polarized binary data represented by the input fluxon with the single bit of polarized binary data represented by the stored fluxon in response to the input fluxon reflecting off the reversible memory cell.

Another illustrative embodiment provides a method of reading and writing binary data with a superconducting reversible memory element. The method comprises storing a stationary fluxon in a reversible memory cell comprising a Josephson junction and a passive inductor, wherein the stationary fluxon represents a single bit of polarized binary data, and wherein the reversible memory cell is connected to a bidirectional input/output port. An input fluxon is ballistically propagated along a transmission line connected to the bidirectional input/output port, wherein the input fluxon represents a single bit of polarized binary data. The single bit of polarized binary data represented by the input fluxon is exchanged with the single bit of polarized binary data represented by the stored fluxon in response to the input fluxon reflecting off the reversible memory cell.

The features and functions can be achieved independently in various examples of the present disclosure or may be combined in yet other examples in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
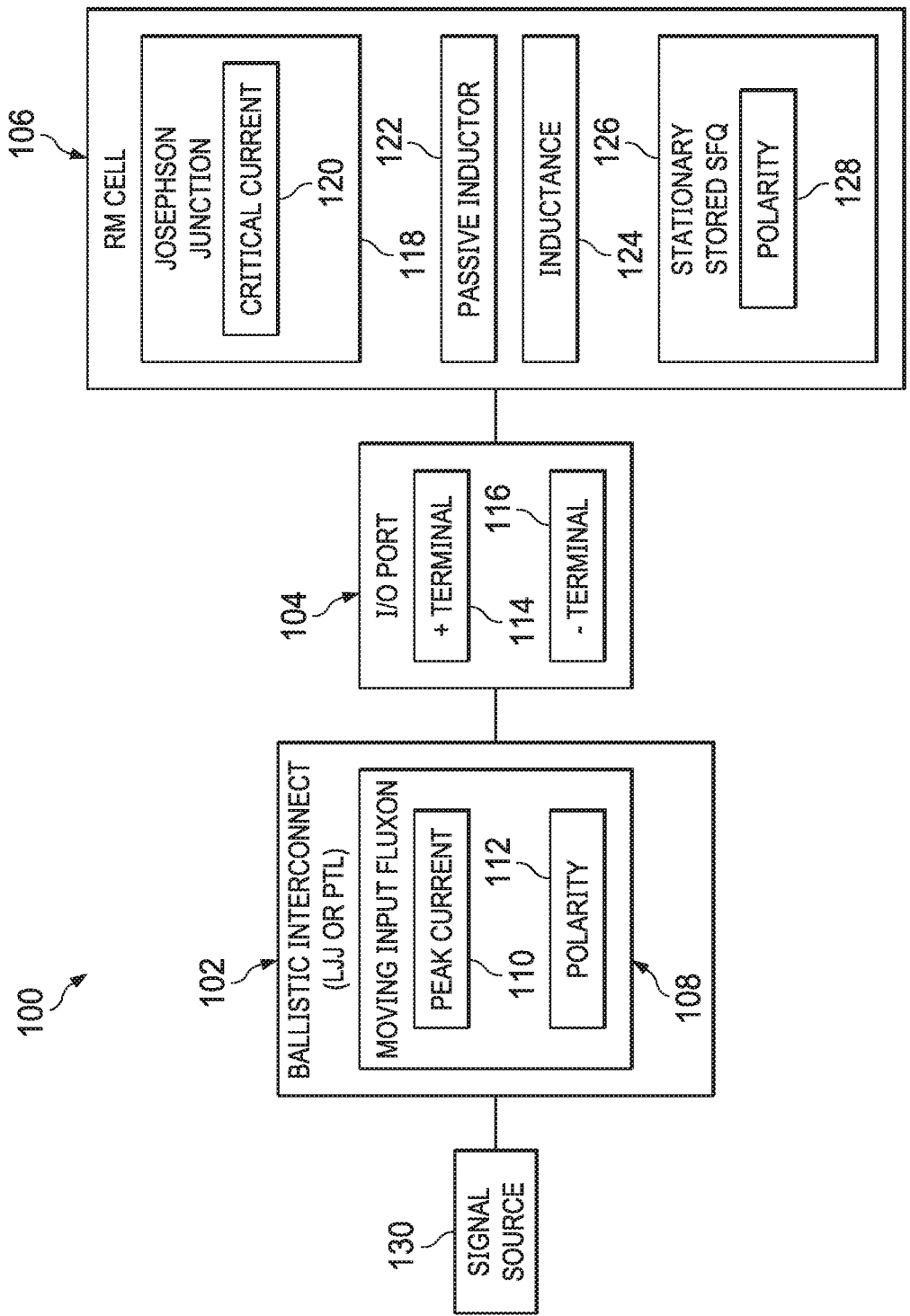
FIG. 1 depicts a block diagram illustrating a reversible memory element in accordance with an illustrative embodiment.

The illustrative embodiments recognize and take into account one or more different considerations. For example, the illustrative embodiments recognize and take into account that existing design styles for superconducting logic fall primarily into two classes, neither of which offers a clear long-term sustainable prospect for continually improving energy efficiency at a given level of cost-efficiency.

The illustrative embodiments recognize and take into account that irreversible Single Flux Quanta (SFQ)-based logics encode and transmit information in SFQ but manipulate these quanta in a logically and physically irreversible manner, thereby dissipating at least on the order of an SFQ energy with each logic operation. Meanwhile the SFQ energy itself is constrained by reliability requirements to be large compared to the kT thermal energy scale, typically on the order of 100-1,000 kT. Thus, for any given environment temperature, T, there is no long-term potential to sustainably continue improving the energy efficiency of these logic styles. Examples of irreversible SFQ-based logics include rapid SFQ (RSFQ), energy-efficient rapid (ERSFQ), energy-efficient SFQ (eSFQ), and Reciprocal Quantum Logic (RQL).

The illustrative embodiments also recognize and take into account that adiabatic superconducting logics can theoretically approach unlimited energy efficiency but at the cost of reduced operating frequency, which also reduces cost-efficiency. Thus, given any fixed target level of cost-efficiency, this approach does not provide a path to continue improving energy efficiency within a cost-efficiency constraint, assuming manufacturing cost per logic gate cannot decline indefinitely. Examples of adiabatic superconducting logics include adiabatic quantum-flux-parametron (AQFP), and reversible quantum-flux-parametron (RQFP).

The illustrative embodiments recognize and take into account that energy-efficient superconducting logic should approach logical and physical reversibility, reusing the digital signal energy for multiple useful operations while dissipating only an arbitrarily small fraction of signal energy on each operation. The illustrative embodiments also recognize and take into account that superconducting logic should not be inherently limited by the fixed energy-delay products of existing adiabatic styles of reversible superconducting logic but should rather permit steady reductions in energy-delay product without correspondingly substantial reductions in manufacturing cost-efficiency (performance per device).

The ABRC (Asynchronous Ballistic Reversible Computing) model of computation envisions a network circuit model in which information-bearing entities (pulses) propagate ballistically between stateful devices (elements), scattering elastically off those devices while performing deterministic, reversible transformations of their local digital state. The benefit of this model is in providing a framework for energy-efficient computation that does not require logical transitions to be controlled by externally provided clock signals.

The illustrative embodiments provide a reversible memory (RM) element that has a single bidirectional input/output (I/O) port and two possible internal states. The illustrative embodiments implement an ABRC model using superconducting electronic (SCE) circuits based on Josephson junctions (JJs) as the active device. ABRC pulses are embodied as flux solitons (fluxons) propagating along long Josephson junction (LJJ) transmission lines. These fluxons can naturally represent binary data in their flux winding orientation (polarization). When an input fluxon propagating along a LJJ transmission line reflects off the RM cell, the RM cell exchanges a single bit's worth of binary data contained in the input fluxon with another single bit's worth of binary data contained in the cell's internal state variable. As such, a new bit value is written to the RM cell at the same time that the old bit value is read out. The bit value stored in the RM cell is preserved indefinitely until a new pulse arrives.

FIG. 1 depicts a block diagram illustrating a reversible memory element in accordance with an illustrative embodiment. RM element 100 comprises ballistic interconnect 102, bidirectional I/O port 104, and RM cell 106.

RM cell (loop) 106 might be a variation of a SQUID (Superconducting Quantum Interference Device) comprising Josephson junction 118 and passive inductor 122. Josephson junction 118 is the active device in RM cell 100. Simply stated, a Josephson junction is made of two superconductors separated by a non-superconducting barrier. Below critical current 120, there is no electrical resistance in the superconductors, and therefore no loss of energy, allowing electrons to flow across the barrier via tunneling. The inductance 124 of RM cell 106 is sized such that the cell can store one stationary magnetic flux quantum (SFQ) 126 without exceeding the critical current 120 of Josephson junction 118 but no more. The stored SFQ 126 has a magnetic (+/−) polarity 128.

Ballistic interconnect 102 comprises a transmission line configured for the propagation of a moving input fluxon 108. Ballistic interconnect 102 might be a Long Josephson junction (LJJ) or passive transmission line (PTL). Moving input fluxon 108 is a quantum of magnetic flux supplied by input source 130. In the context of an LJJ, such as ballistic interconnect 102, moving input fluxon 108 comprises circulating supercurrents with no dissipation of energy. Fluxon 108 can be thought of as an isolated wave propagating through ballistic interconnect 102 and has its own respective (+/−) polarity 112.

Ballistic interconnect 102 is connected to RM cell 106 through positive (+) terminal 114 and negative (−) terminal 116 of the I/O port 104, which are shunted across the Josephson junction 118 and inductor 122. Superconductivity allows the moving input fluxon 108 to propagate along ballistic interconnect 102 and reflect off RM cell 106 elastically with virtually no dissipation of energy. The critical current 120 of Josephson junction 118 is matched to approximately one half of the peak current 110 of the moving input fluxon 108. The similarity or difference between polarity 112 and polarity 128 determines the effect of fluxon 108 reflecting off RM cell 106 (see FIG. 2 and Table I).

Because RM element 100 is a "floating" circuit with no bias current inputs or direct ground path it is powered solely by input pulses.

The illustrative embodiments provide a new logic style based on ballistic propagation of single flux quanta between interaction points at which they deterministically scatter elastically. The illustrative embodiments utilize discrete topological degrees of freedom, such as the presence of so-called "kinks" in the configuration of the continuous phase degree of freedom along the length of the LJJ, which naturally tend to be stable and self-restoring to digitally well-defined states in the face of small perturbations. The presence of a moving fluxon 108 in LJJ transmission line 102 is an example of such a topological quantity in a superconducting circuit, which constitutes a type of topological soliton that conserves the orientation of the quantized flux toroid that is threaded through and around the junction.

These topological states are naturally stable entities (retaining their cohesion indefinitely), except that they can mutually annihilate when they encounter an oppositely polarized fluxon. Moreover, any direct interactions between moving fluxons can allow uncertainties in the relative timing of the fluxons to be amplified exponentially, leading to chaotic instabilities in the dynamics.

Direct interactions can be avoided if different fluxons encounter the designated interaction sites at separated points in time, and if the dynamical state of the circuit at the interaction site can be taken to have relaxed into a stationary state by the time the next fluxon arrives.

Figure 2A:
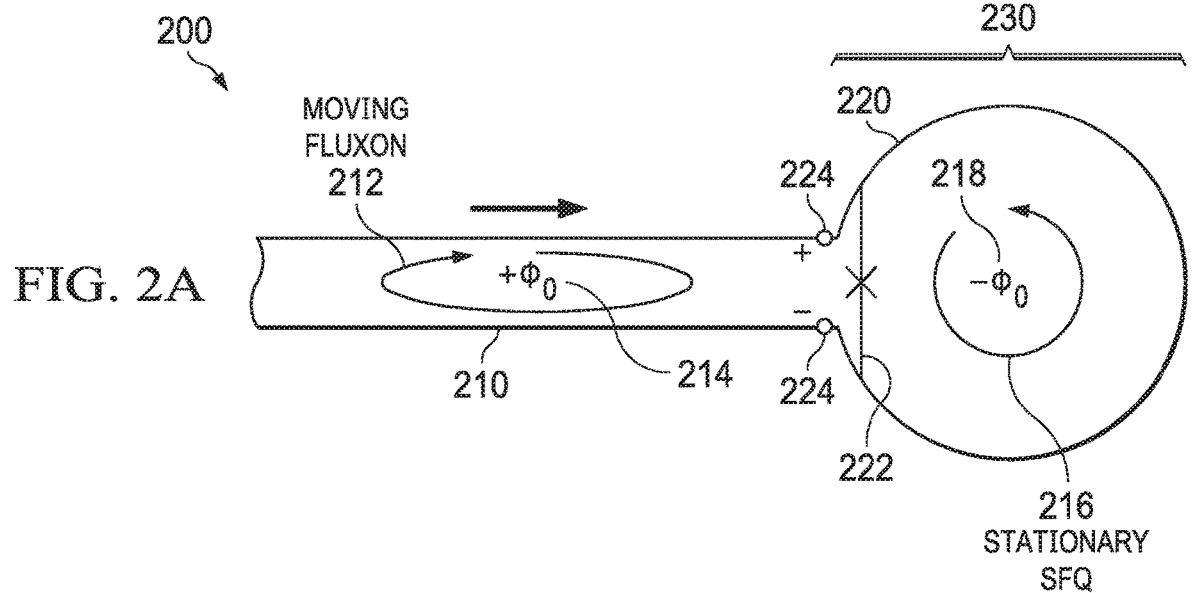
FIG. 2A illustrates an input fluxon moving toward an RM cell in accordance with an illustrative embodiment.
Figure 2B:
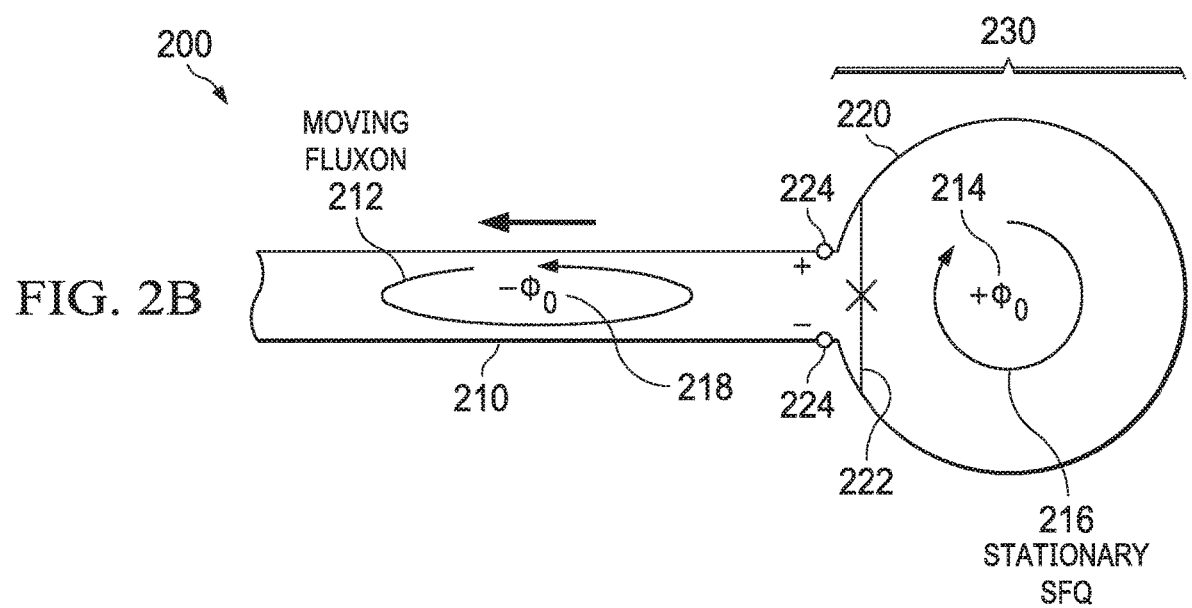
FIG. 2B illustrates an output fluxon reflecting off an RM cell after exchanging polarities with the stationary SFQ in accordance with an illustrative embodiment.

FIGS. 2A and 2B depict the operation of a superconducting reversible memory element in accordance with an illustrative embodiment. FIG. 2A illustrates an input fluxon moving toward an RM cell. FIG. 2B illustrates an output fluxon reflecting off the RM cell after exchanging polarities with the stationary SFQ. RM element 200 might be an example of RM element 100 shown in FIG. 1.

RM element 200 implements an Asynchronous Ballistic Reversible Computing (ABRC) model of digital computation using fluxon propagation in an LJJ (or PTL) 210 to conserve flux while utilizing fluxon polarization to encode binary data. RM element 200 is a one-port, two-state device comprising a planar, unbiased, reactive circuit with a continuous superconducting boundary that conserves flux and approximately conserves energy if the Josephson junction 222 in RM cell 230 stays below critical current.

In the example shown in FIG. 2A, incoming moving fluxon 212 propagates ballistically along LJJ 210. Fluxon 212 has a positive polarity 214. RM cell 230, comprising passive inductor 220 and Josephson junction 222, store a single stationary flux quantum 216. Stationary SFQ 216 can be thought of as a standing wave. In the present example, stationary SFQ 216 has a negative polarity 218. The rails of LJJ 210 are connected to RM cell 230 at the positive and negative terminals of bidirectional port 224.

LJJ 210 can be considered as either one long continuous Josephson junction, or equivalently as many small JJs wired in parallel between the rails of the transmission line. In the latter view, the inductance between the small, parallel JJs is too small to store an entire SFQ. Therefore, the fluxon is spread over many small unit cells, which leads to the flux soliton behavior in which the SFQ is no longer trapped in any one location but can freely move along the length of the interconnect 210. In contrast, Josephson junction 222 in RM cell 230 is larger (by about 5×), and the inductance of the RM cell (storage loop) 230 is larger, with the net effect that an entire SFQ fits in the storage loop and stays trapped there until it is released in an exchange operation.

As shown in FIG. 2B, the moving fluxon 212 elastically scatters from the interaction with the RM cell 230 but with its polarization 218 exchanged with that of the stationary stored SFQ 216 stored in the RM cell 230. Therefore, as a result of the interaction of the input fluxon 212 with the RM cell 230, RM element 200 reads out the state (polarity) 218 of stationary SFQ 216 and writes in the state (polarity) 214 of the moving input fluxon 212. It should be noted that the polarity of the outgoing fluxon will only reverse from the incoming fluxon if the polarities of the incoming fluxon and stored SFQ differ from each other.

Table I is a transition table for the functional behavior of the RM element according to the respective polarities of the input fluxon and stored SFQ.

TABLE I

DIGITAL TRANSITION TABLE FOR FUNCTIONAL BEHAVIOR OF THE REVERSIBLE MEMORY (RM) ELEMENT

| Input Syndrome | | Output Syndrome | |
|---|---|---|---|
| Incoming Fluxon Polarity | Initial Stored Flux | Final Stored Flux | Outgoing Fluxon Polarity |
| +1 | (+1) | (+1) | +1 |
| +1 | (−1) | (+1) | −1 |
| −1 | (+1) | (−1) | +1 |
| −1 | (−1) | (−1) | −1 |

RM element 200 reads out the old bit-value of the stored SFQ and writes in a new bit-value simultaneously, in a logically and physically reversible manner. The speed of read/write operations of RM element 200 is on the order of 10 picoseconds.

Figure 3:
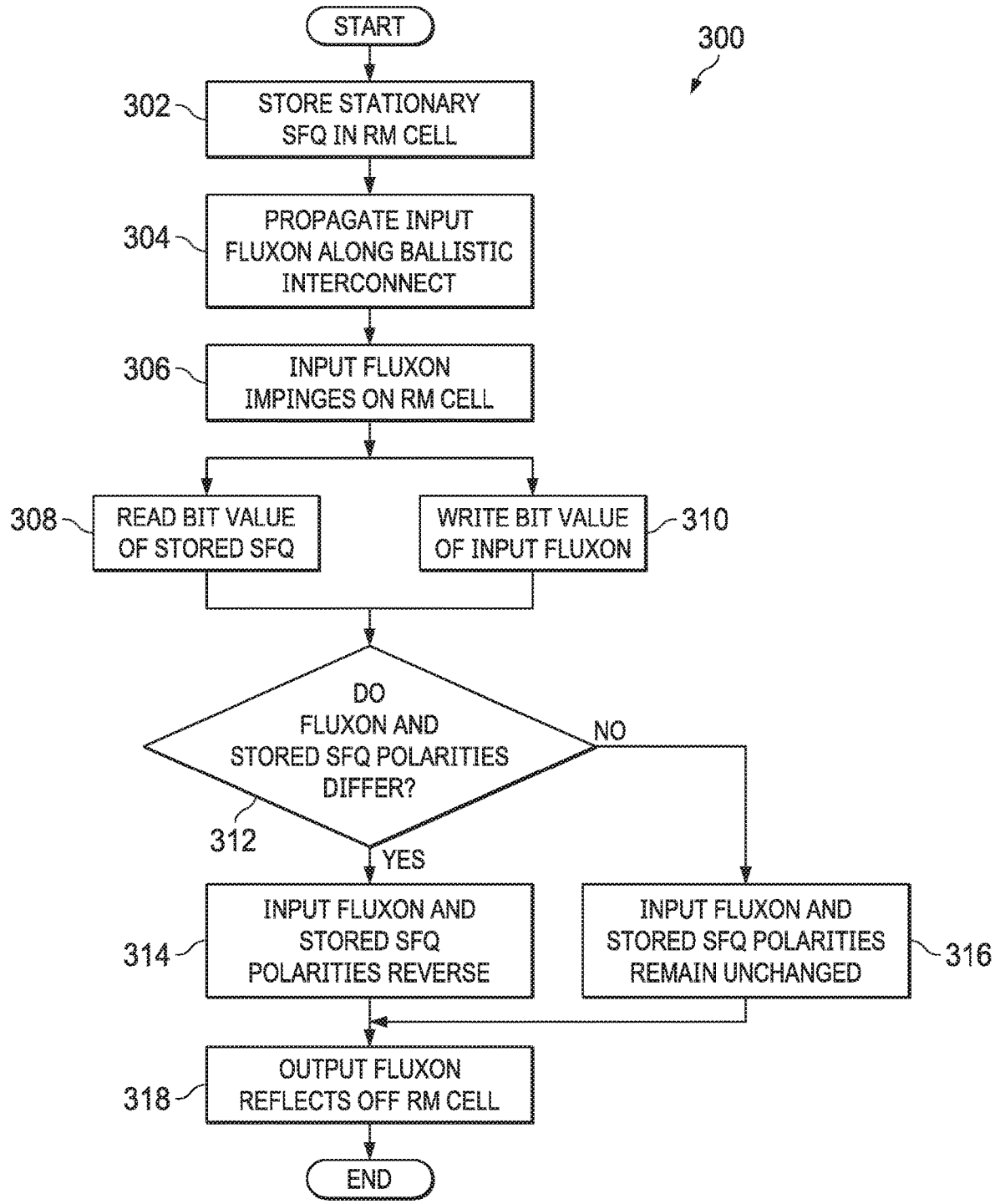
FIG. 3 depicts a flowchart illustrating a process of writing and reading binary data with a superconducting reversible memory element in accordance with an illustrative embodiment.

FIG. 3 depicts a flowchart illustrating a process of writing and reading binary data with a superconducting reversible memory element in accordance with an illustrative embodiment. Process 300 can be implemented in an RM element such as RM elements 100 and 200 in FIGS. 1, 2A, and 2B.

Process 300 begins by storing a stationary SFQ in the RM cell (step 302). Next, an input fluxon is propagated along the ballistic interconnect (step 304). The ballistic interconnect might be a LJJ or PTL. The input fluxon impinges on the RM cell (step 306).

As a result of the input fluxon's interaction with the RM cell, the RM element simultaneously reads the bit value of the stored SFQ (step 308) and writes the bit value of the input fluxon (step 310) represented by their respective polarities. The results of the read and write operations of steps 308 and 310 depend on whether the polarities of the input fluxon and stored SFQ differ from each other (step 312).

If the polarities of the input fluxon and stored SFQ do not differ from each other, the polarities of the input fluxon and stored SFQ remain unchanged as a result of the input fluxon's interaction with RM cell (step 316). If the polarities of the input fluxon and stored SFQ do differ from each other, the polarities of the input fluxon and stored SFQ reverse as a result of the input fluxon's interaction with RM cell (step 314).

The input fluxon elastically reflects off the RM cell, thereby becoming an output fluxon, with virtually no energy dissipation (step 318). Process 300 then ends.

The illustrative embodiments may implement additional ABRC circuit elements. Input fluxons introduced into a complex ABRC circuit can shuttle elastically within the structure and emerge from the circuit in a configuration that encodes the result of multiple parallel and sequential steps of computation, with the majority of the initial fluxon kinetic energy still present and with minimal dissipative losses.

Figure 4:
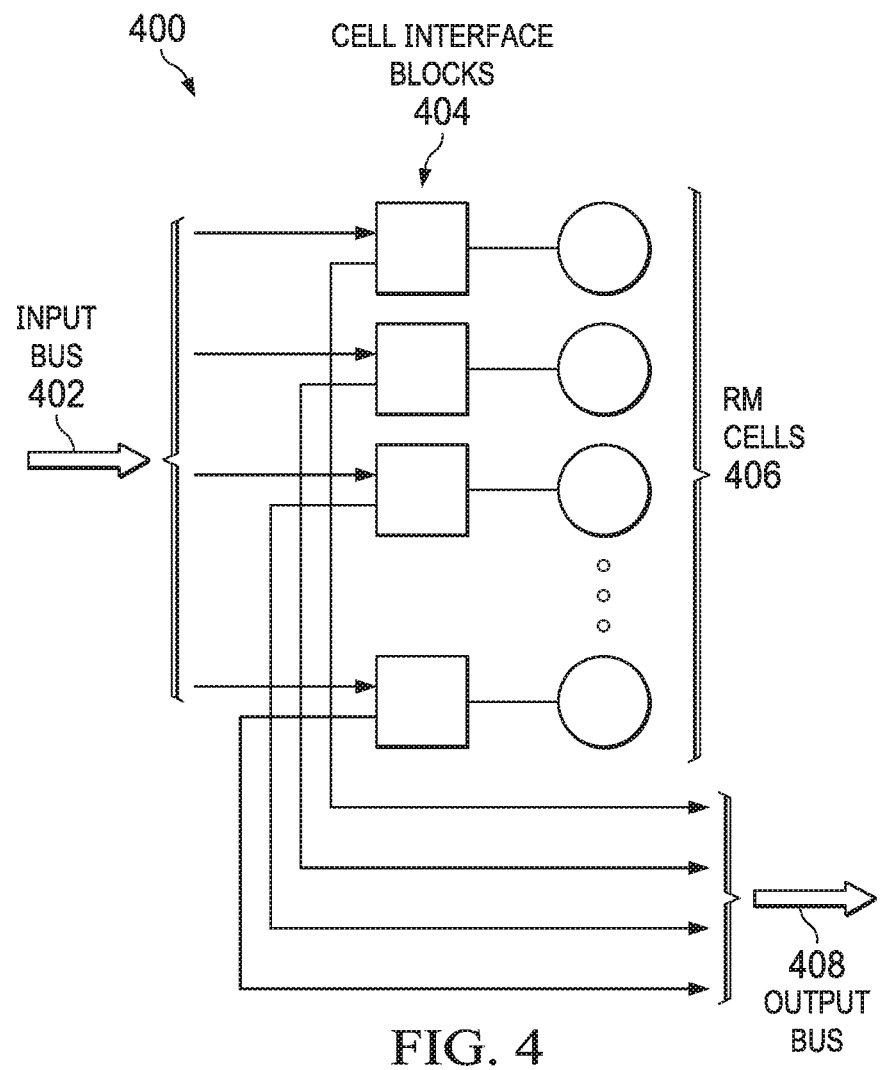
FIG. 4 depicts a multi-bit register incorporating reversible memory elements in accordance with an illustrative embodiment.
Figure 5:
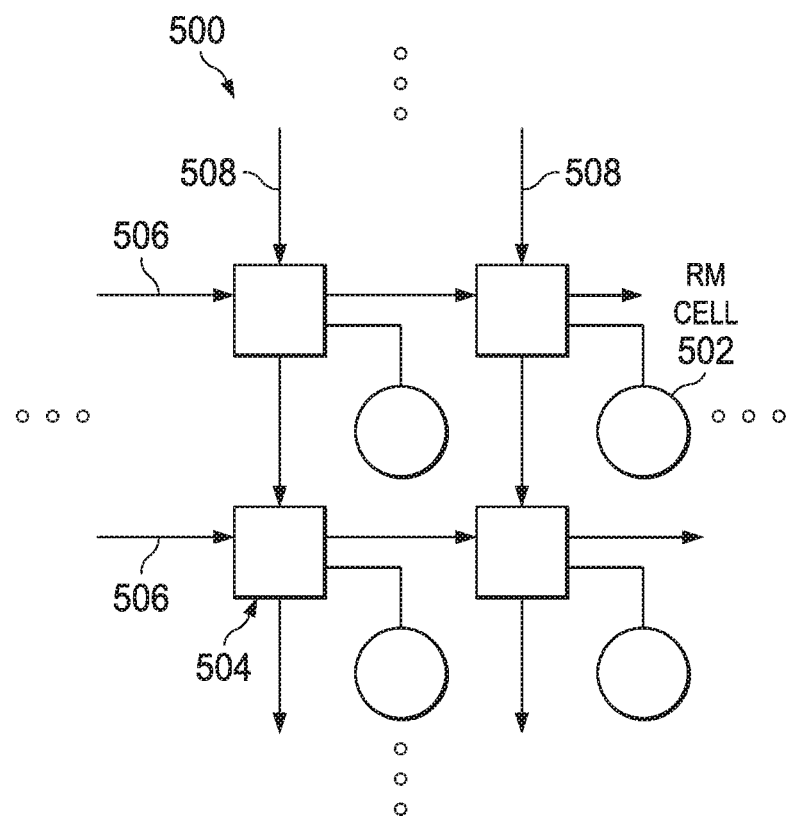
FIG. 5 depicts reversible memory elements implemented in a memory in accordance with an illustrative embodiment.
Figure 6:
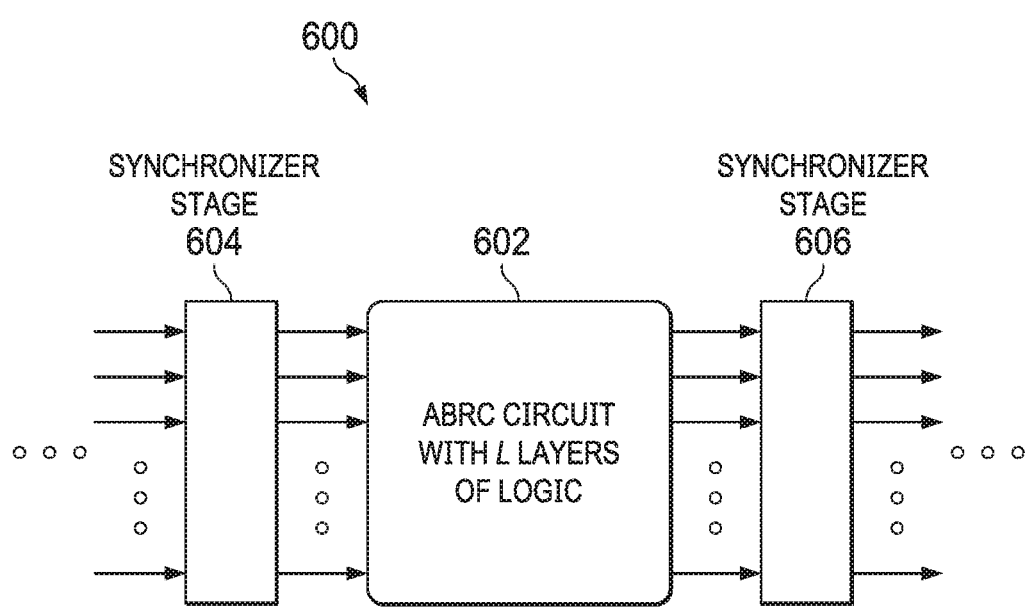
FIG. 6 depicts an Asynchronous Ballistic Reversible Computing circuit between synchronizer stages in accordance with an illustrative embodiment.

FIGS. 4-6 illustrate examples of higher-level applications of the RM element of the illustrative embodiment in larger architectures.

FIG. 4 depicts a multi-bit register incorporating reversible memory elements in accordance with an illustrative embodiment. In the example shown, register 400 is an N-bit linear register. Input bus 402 provides input data to cell interface blocks 404, which read/write data to and from RM cells 406. Output from RM cells 406 is fed back through cell interface blocks 404 to output bus 408.

FIG. 5 depicts reversible memory elements implemented in a memory in accordance with an illustrative embodiment. In the present example, memory array 500 comprises a 2-D memory fabric in a random access memory (RAM). An RM cell 502 is located at each intersection 504 between a word line 506 and bit line 508.

FIG. 6 depicts an ABRC circuit between synchronizer stages in accordance with an illustrative embodiment. Circuit 600 comprises a complex ABRC circuit 602 with L layers of clockless logic/memory incorporating RM cells such as cells 100 and 200. The ABRC circuit 602 is located between a first synchronizer stage 604 and a second synchronizer stage 606.

In designing more complex ABRC circuit elements several potential constraints might apply to the design. One constraint that might apply is that the circuit may not include any elements with nonzero, finite DC resistances. The circuit will only include pure reactive elements, i.e., those featuring divergent DC resistance or conductance such as superconducting inductors, lossless capacitors, and mutual inductances between superconductors.

Another possible constraint is that the only nonlinear elements used are undamped (not self-shunted) Josephson junctions (JJs), although other superconducting devices such as quantum phase-slip junctions or magnetically biased JJs may also be considered. The design should be such that any JJs that exist in the circuit should spend little or no time in the supercritical voltage state ($I > I_0$), minimizing the dissipative impact of the junction's normal-mode resistance RN. Minimal time should be spent on the subgap (quasiparticle) branch as well, and/or the subgap resistance Ro should be chosen to minimize $I/^2/R_0$ losses.

Another possible constraint is to only use circuit designs that can be rendered as planar schematics with a continuous superconducting boundary (i.e., no JJs or capacitors on the boundary). Such circuits must conserve total flux threading the boundary, which simplifies the design space.

By using circuits with no bias currents (neither DC nor AC), no power input is required other than the initially injected data fluxons. However, in practice, applications of the illustrative embodiments might provide some power in bias inputs to continually compensate for actual (but still very small) losses that exist in the circuit.

Care should also be taken to minimize parasitic dissipative effects resulting from RF emission, loss tangents in surrounding dielectric materials, and other physical nonidealities.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiment. The terminology used herein was chosen to best explain the principles of the embodiment, the practical application or technical improvement over technologies found in the marketplace, or to enable others of ordinary skill in the art to understand the embodiments disclosed here.

What is claimed is:

1. A reversible memory element, comprising:
    a reversible memory cell, comprising:
        a Josephson junction; and
        a passive inductor connected to the Josephson junction such that the passive inductor and the Josephson junction form a loop;
    a ballistic interconnect; and
    a bidirectional input/output port connecting the reversible memory cell and ballistic interconnect, wherein terminals of the bidirectional input/output port are shunted across the Josephson junction and shunted across the passive inductor;
    wherein a polarized input fluxon propagating along the ballistic interconnect exchanges polarity with a stationary stored fluxon in the reversible memory cell in response to the input fluxon reflecting off the reversible memory cell.

2. The reversible memory element of claim 1, wherein the reversible memory element is a floating circuit that is powered solely by the input fluxon.

3. The reversible memory element of claim 1, wherein the terminals of the bidirectional input/output port are positive and negative terminals.

4. The reversible memory element of claim 1, wherein the input fluxon and stored fluxon both reverse polarities in response to the input fluxon reflecting off the reversible memory cell if the respective polarities of the input fluxon and stored fluxon differ from each other.

5. The reversible memory element of claim 1, wherein the Josephson junction has a critical current matched to approximately one half of the peak current of the input fluxon.

6. The reversible memory element of claim 1, wherein the exchange of polarities between the input fluxon and stored fluxon constitutes a read/write operation.

7. The reversible memory element of claim 6, wherein the read/write operation exchanges a single bit's worth of binary data contained in the input fluxon with another single bit's worth of binary data contained in the stored fluxon.

8. The reversible memory element of claim 6, wherein the read/write operation occurs at a speed of approximately 10 picoseconds.

9. The reversible memory element of claim 1, wherein the input fluxon reflects elastically off the reversible memory cell.

10. The reversible memory element of claim 1, wherein the ballistic interconnect comprises a long Josephson junction.

11. The reversible memory element of claim 1, wherein the ballistic interconnect comprises a passive transmission line.

12. The reversible memory element of claim 1, wherein the reversible memory element is a component of:
    a linear register; or
    a two-dimensional memory array.

13. A reversible memory element, comprising:
    a first Josephson junction, wherein the first Josephson junction comprises a long Josephson junction configured to ballistically propagate an input fluxon representing a single bit of polarized binary data;
a reversible memory cell comprising a second Josephson junction and a passive inductor connected to the second Josephson junction such that the passive inductor and the second Josephson junction form a loop, wherein the reversible memory cell is configured to store a stationary fluxon representing a single bit of polarized binary data;
a bidirectional input/output port connecting the first Josephson junction and the reversible memory cell, wherein terminals of the bidirectional input/output port are shunted across the second Josephson junction and shunted across the passive inductor;
wherein the reversible memory cell is configured to exchange the single bit of polarized binary data represented by the input fluxon with the single bit of polarized binary data represented by the stored fluxon in response to the input fluxon reflecting off the reversible memory cell.

14. The reversible memory element of claim 13, wherein the reversible memory element is a floating circuit that is powered solely by the input fluxon.

15. The reversible memory element of claim 13, wherein the input fluxon and stored fluxon both reverse polarities in response to the input fluxon reflecting off the reversible memory cell if the respective polarities of the input fluxon and stored fluxon differ from each other.

16. The reversible memory element of claim 13, wherein the second Josephson junction in the reversible memory cell has a critical current matched to approximately one half of the peak current of the input fluxon.

17. The reversible memory element of claim 13, wherein the input fluxon reflects elastically off the reversible memory cell.

18. A method of reading and writing binary data with a superconducting reversible memory element, the method comprising:
storing a stationary fluxon in a reversible memory cell comprising a Josephson junction and a passive inductor connected to the Josephson junction such that the passive inductor and the Josephson junction form a loop, wherein the stationary fluxon represents a single bit of polarized binary data, and wherein the reversible memory cell is connected to a bidirectional input/output port, wherein terminals of the bidirectional input/output port are shunted across the Josephson junction and shunted across the passive inductor;
ballistically propagating an input fluxon along a transmission line connected to the bidirectional input/output port, wherein the input fluxon represents a single bit of polarized binary data; and
exchanging the single bit of polarized binary data represented by the input fluxon with the single bit of polarized binary data represented by the stored fluxon in response to the input fluxon reflecting off the reversible memory cell.

19. The method of claim 18, wherein the input fluxon and stored fluxon both reverse polarities in response to the input fluxon reflecting off the reversible memory cell if the respective polarities of the input fluxon and stored fluxon differ from each other.

20. The method of claim 18, wherein the exchange of the single bit of polarized binary data represented by the input fluxon with the single bit of polarized binary data represented by the stored fluxon occurs at a speed of approximately 10 picoseconds.

21. The method of claim 18, wherein the input fluxon reflects elastically off the reversible memory cell.

* * * * *